United States Patent [19]

Blanken

[11] Patent Number: 4,872,209
[45] Date of Patent: Oct. 3, 1989

[54] INTEGRATABLE AMPLIFIER CIRCUIT HAVING FREQUENCY RESPONSIVE NEGATIVE FEEDBACK

[75] Inventor: Pieter G. Blanken, Eindhoven, Netherlands

[73] Assignee: U.S. Philips Corporation, New York, N.Y.

[21] Appl. No.: 263,680

[22] Filed: Oct. 27, 1988

[30] Foreign Application Priority Data

Oct. 28, 1987 [NL] Netherlands ................. 8702559

[51] Int. Cl.⁴ .............................................. M03F 1/34
[52] U.S. Cl. ..................................... 330/294; 330/260
[58] Field of Search ............... 330/252, 257, 260, 291, 330/294, 300, 307, 293

[56] References Cited

U.S. PATENT DOCUMENTS

| 4,540,952 | 9/1985 | Williams | 330/279 |
|---|---|---|---|
| 4,555,676 | 11/1985 | van de Plassche et al. | 330/294 X |
| 4,574,249 | 3/1986 | Williams | 330/59 |

FOREIGN PATENT DOCUMENTS 2105543A of 1981 United Kingdom ................ 330/279

OTHER PUBLICATIONS

IEEE Journal of Solid-State Circuits, vol. SC-6, No. 6, Dec. 1971, pp. 347-352, van de Plassche, "A Wide-Band Operational Amplifier with a New ...".
Patent Abstracts of Japan, vol. 4, No. 48, (E-6)(530), 12 Apr. 1980.

*Primary Examiner*—Steven Mottola
*Attorney, Agent, or Firm*—Edward W. Goodman

[57] ABSTRACT

In an amplifier arrangement, including a transadmittance circuit having an input coupled to an input of the amplifier arrangement, and a transimpedance amplifier having an input coupled to an output of the transadmittance circuit and an output coupled to an output of the amplifier arrangement, in which the transfer function modulus of the transimpedance amplifier has a first-order decrease above a first frequency F1 and a second-order decrease above a second frequency F2, which transimpedance amplifier is negatively fed back by means of a negative current feedback circuit, the negative current feed back circuit is constituted by a negative feedback impedance whose inverse of the transfer function modulus below the second frequency F2 is smaller than the transfer function modulus of the transimpedance amplifier and which transfer function modulus has a first-order increase above a third frequency F3 so that the transfer function modulus of the negatively fed back transimpedance amplifier has a first-order decrease above a fourth frequency F4 which is substantially equal to the third frequency F3, and a second-order decrease above the fifth frequency F5 which is located above the second frequency F2, the transfer function modulus of the transadmittance circuit has a first-order increase above a sixth frequency F6 which is substantially equal to the fourth frequency F4, so that the transfer function modulus of the amplifier arrangement has a first-order decrease above the fifth frequency F5, and the transimpedance amplifier has a low-ohmic current input with an input impedance whose modulus, at least for frequencies below the fifth frequency F5, is smaller than the modulus of the negative feedback impedance, so that the bandwidth of the amplifier arrangement is enlarged.

22 Claims, 7 Drawing Sheets

INTEGRATABLE AMPLIFIER CIRCUIT HAVING FREQUENCY RESPONSIVE NEGATIVE FEEDBACK

BACKGROUND OF THE INVENTION

1. Field of the Invention

The invention relates to an amplifier arrangement comprising a transadmittance circuit having an input coupled to an input of the amplifier arrangement, and a transimpedance amplifier having an input coupled to an output of the transadmittance circuit and an output coupled to an output of the amplifier arrangement, the transfer function modulus of the transimpedance amplifier having a first-order decrease above a first frequency F1 and a second-order decrease above a second frequency F2, said transimpedance amplifer being negatively fed back by means of a negative current feedback circuit.

2. Description of Related Art

An amplifier of this type used as an instrumentation is known from IEEE Journal of Solid-State Circuits, December 1975, pages 424-431. The negatively fed back transimpedance amplifier shown in FIG. 5 of this Article is constituted by a voltage amplifier whose input is connected to ground by means of an input resistor. A current applied to this input produces a voltage across the input resistor, which voltage is subsequently amplified by the voltage amplifier. The output of the voltage amplifier is coupled to its input by means of a transconductance amplifier which ensures a negative current feedback.

In this known arrangement, the negative current feedback circuit is constituted by a transconductance amplifier having an output resistance which is large as compared with the input resistance of the transimpedance amplifier, which is relatively large anyway in the known transimpedance amplifier. However, a drawback of using a transconductance amplifier is that it should be able to cope with a large voltage swing of the output signal of the transimpedance amplifier as in the case of, for example, a video output amplifier. However, such a transconductance circuit cannot be realized in a simple manner. Another detrimental result of the finite value of the input resistance of the transimpedance amplifier is that, together with parasitic capacitances which are present, it limits the bandwidth of the amplifier arrangement.

Amplifier arrangements having a relatively large bandwidth are required for, for example, high-definition television, color-graphic display devices, computer monitors and digital signal processing of signals sampled at high sampling frequencies. The bandwidth of the known amplifier arrangement is, however, too limited for such uses.

SUMMARY OF THE INVENTION

It is therefore an object of the invention to provide an amplifier arrangement having a larger bandwidth than the known amplifier arrangement.

According to the invention, an amplifier arrangement of the type described in the opening paragraph is therefore characterized in that the negative current feedback circuit is constituted by a negative feedback impedance whose inverse of the transfer function modulus below the second frequency F2 is smaller than the transfer function modulus of the transimpedance amplifier and which transfer function modulus has a first-order increase above a third frequency F3 so that the transfer function modulus of the negatively fed back transimpedance amplifier has a first-order decrease above a fourth frequency F4 which is subsequently equal to the third frequency F3, and a second-order decrease above a fifth frequency F5 which is located above the second frequency F2, the transfer function modulus of the transadmittance circuit has a first-order increase above a sixth frequency F6 which is substantially equal to the fourth frequency F4, so that the transfer function modulus of the amplifier arrangement has a first-order decrease above the fifth frequency F5, and the transimpedance amplifier has a low-ohmic current input with an input impedance whose modulus, at least for frequencies below the fifth frequency F5, is smaller than the modulus of the negative feedback impedance.

Since, unlike the known transimpedance amplifier, the transimpedance amplifier now has a low-ohmic current input, the transition frequency caused by the parasitic capacitances will be much higher so that these parasitic capacitances have much less influence. The first-order decrease of the transfer function modulus of the negatively fed back transimpedance amplifier above the fourth frequency F4, which is the result of the first-order increase of the transfer function modulus of the negative feedback impedance above the third frequency F3, is compensated by the first-order increase of the transfer function modulus of the transadmittance circuit above the sixth frequency F6 which is chosen to be equal to the fourth frequency F4 as much as possible. Consequently, a first-order decrease of the transfer function modulus of the amplifier arrangement according to the invention does not occur until above the fifth frequency F5 which is larger than the second frequency F2.

To obtain a phase margin which is at least 45°, a first elaboration of an amplifier arrangement according to the invention is preferably characterized in that the second frequency F2 is larger than the approximately one fifth of the fifth frequency F5. In fact, the transfer function modulus of the transimpedance amplifier will generally have third-order and higher order decreases above further transition frequencies which are located above the second frequency F2, which are accompanied by an increasing phase shift so that, if the second frequency F2 is much smaller than the fifth frequency F5, the phase shift of this fifth frequency F5 can become larger than 135° so that the phase margin will become similar than a desirable minimum phase margin of 45°.

A second further elaboration of the amplifier arrangement according to the invention is preferably characterized in that the third frequency F3 is larger than approximately one fifth of the fifth frequency F5. In fact, if the third frequency F3 is chosen to be relatively low when using the amplifier arrangement according to the invention as a video output amplifier, and if the sixth frequency F6 in the transfer function of the transadmittance circuit is not fully equal to the frequency F4 in the transfer function of the negatively fed back transimpedance amplifier, visible low-frequency interferences will appear in the picture. If the interferences occur at a higher frequency, namely if the frequencies F3, F4 and F6 are higher, there interferences will be much less visible.

As will be described in greater detail with reference to FIG. 3C, a further elaboration of the invention is preferably characterized in that the third frequency F3 is not larger than the second frequency F2.

A first embodiment of an amplifier arrangement according to the invention is characterized in that the negative feedback impedance comprises a parallel arrangement of a resistor and a capacitor.

A second embodiment of an amplifier arrangement according to the invention is characterized in that the transadmittance circuit comprises a parallel arrangement of a resistor and a capacitor.

A third embodiment of an amplifier arrangement according to the invention is characterized in that the transadmittance circuit is a transadmittance amplifier which comprises a differential amplifier degenerated by a parallel arrangement of a resistor and a capacitor so that a relatively high output resistance of the transadmittance amplifer is obtained.

A fourth embodiment of an amplifier arrangement according to the invention is characterized in that the transadmittance circuit is a transadmittance amplifier which comprises a parallel arrangement of a transconductance amplifier and a transsusceptance amplifier.

This embodiment may be further characterized in that the transconductance amplifier comprises a differential amplifier degenerated by a resistor and in that the transsusceptance amplifier comprises a differential amplifier degenerated by a capacitor.

To obtain the flattest possible amplitude characteristic of the transfer function of the amplifier arrangement, it is important that the first-order increase of the transfer function modulus of the transadmittance circuit occurs, as much as possible, at the same frequency F4 as the first-order decrease of the transfer function modulus of the negatively fed back transimpedance amplifier, which is the result of the first-order increase of the transfer function modulus of the negative feedback circuit occurring at the third frequency F3. An amplifier arrangement according to the invention is therefore preferably characterized in that the transadmittance circuit comprises adjusting means for adjusting the sixth frequency F6 in the transfer function of the transadmittance circuit. In a simple construction these adjusting means may be constituted by means for adjusting the resistance of the resistor and/or the capacitance of the capacitor.

In a further embodiment of an amplifier arrangement in conformity with the fourth embodiment these adjusting means may be characterized in that they comprise:

a first adjusting circuit in which it can be determined, by means of a first adjusting resistor, which part of a current, dependent on an input voltage at the input of the transadmittance amplifier and on the transconductance of the transconductance amplifier, is passed on to a current output of the transadmittance amplifier, and a second adjusting circuit in which it can be determined, by means of a second adjusting resistor, which part of a current, dependent on the input voltage at the input of the transadmittance amplifier and on the transsusceptance amplifier, is passed on to the current output of the transadmittance amplifier.

The first and the second adjusting circuit may be further characterized in that they are provided with two cross-coupled differential amplifiers an output of which is coupled to an output of the transadmittance amplifier and inputs of which are coupled to respective outputs of a further differential amplifier degenerated by a resistor, a first input of said further degenerate diifferential amplifier being coupled to a wiping contact of the adjusting resistor and a second input being coupled to a reference voltage terminal.

A fifth embodiment of an amplifier arrangement according to the invention, in which a very low-ohmic current input of the transimpedance amplifier and a linear transfer function of the input stage of the transimpedance amplifier is achieved, is characterized in that the transimpedance amplifier has an input stage comprising:

a first differential amplifier including a first and a second transistor, an emitter of the first transistor being coupled to an emitter of the second transistor and to a first current source, a collector of the first transistor being coupled to the input of the transimpedance amplifier and a collector of the second transistor being coupled to a reference voltage terminal; and a second differential amplifier including a third and a fourth transistor, an emitter of the third transistor being coupled to an emitter of the fourth transistor and to a second current source, bases of the third and the fourth transistors being coupled to bases and the collectors of the second and the third transistors, respectively, a collector of the fourth transistor being coupled to a first output of the input stage and a collector of the third transistor being coupled to a second output of the input stage.

A sixth embodiment of an amplifier arrangement according to the invention, in which a very low-ohmic current input of the transimpedance amplifier, a large linearity and a large bandwidth of the transfer function of the input stage of the transimpedance amplifier is achieved, is characterized in that the transimpedance amplifier has an input stage comprising:

a first differential amplifier including a first and a second transistor, an emitter of the first transistor being coupled to an emitter of the second transistor and to a first current source, a collector of the first transistor being coupled to the input of the transimpedance amplifier and a collector of the second transistor being coupled to a reference volage terminal;

a second differential amplifier including a third and a fourth transistor, an emitter of the third transistor being coupled to an emitter of the fourth transistor and to a second current source, bases of the first and the second transistors being coupled to bases and collectors of the fourth and the third transistors, respectively;

a fifth transistor having a base coupled to the input of the transimpedance amplifier, an emitter coupled to the collector of the fourth transistor, and a collector coupled to a first output of the input stage; and a sixth transistor having a base coupled to the reference voltage terminal, an emitter coupled to the collector of the third transistor, and a collector coupled to a second output of the input stage.

The input impedance of the input stage of the transimpedance amplifier according to the fifth and sixth embodiments can be still further decreased if the collector of the second transistor is coupled to the reference voltage terminal via a third differential amplifier having an output coupled to the collector of the second transistor, an inverting input coupled to the input of the transimpedance amplifier, and a non-inverting input coupled to the reference voltage terminal.

In the fifth and sixth embodiments, a large voltage may be produced across the collector-base junctions of the transistors which are coupled to the outputs of the input stage of the transimpedance amplifier, if the output signal of the transimpedance amplifier has a large voltage swing, as is the case, for example, in a video output amplifier. To prevent this, this embodiment may be further characterized in that the collectors which are coupled to the first and the second outputs of the input stage of the transimpedance amplifier are each coupled to said first and second outputs of the input stage by means of a field-effect transistor arranged in common gate configuration.

In a further embodiment, these fifth and sixth embodiments of an amplifier arrangement according to the invention may be characterized in that the first output of the input stage of the transimpedance amplifier is coupled to a first input of an output stage, and in that the second output of the input stage of the transimpedance amplifier is coupled to a second input of the output stage by means of a current mirror circuit, an output of said output stage being coupled to the output of the transimpedance amplifier.

The output stage may be constituted by a push-pull amplifier, a suitable embodiment of which may be characterized in that it comprises:

a first field-effect transistor having a gate and a drain coupled to the second input of the output stage;

a second field-effect transistor having a gate coupled to the gate of the first field-effect transistor, and a source coupled to the output of the output stage;

a third field-effect transistor having a source coupled to the output of the output stage, and a gate coupled to the first input of the output stage; and a fourth field-effect transistor having a source coupled to a source of the first field-effect transistor, and a gate and a drain coupled to the gate of the third field-effect transistor, the first and the second field-effect transistors being of a conductivity type which is opposed to a conductivity type of the third and the fourth field-effect transistors.

The invention also relates to an integrated amplifier circuit which is characterized in that it comprises a transadmittance circuit and/or a transimpedance amplifier suitable for an amplifier arrangement according to the invention.

A favorable embodiment thereof is characterized in that it comprises a current multiplication circuit for multiplying a current in the transadmittance circuit by the quotient of a resistance of a resistor within the integrated amplifier circuit and a resistance of a resistor outside the integrated amplifier circuit.

The invention also relates to a display device including an amplifier which is characterized in that the amplifier comprises an amplifier arrangement according to the invention.

BRIEF DESCRIPTION OF THE DRAWINGS

The invention will now be described in greater detail by way of example with reference to the accompanying drawings, in which.

DESCRIPTION OF THE PREFERRED EMBODIMENTS

Figure 1A:
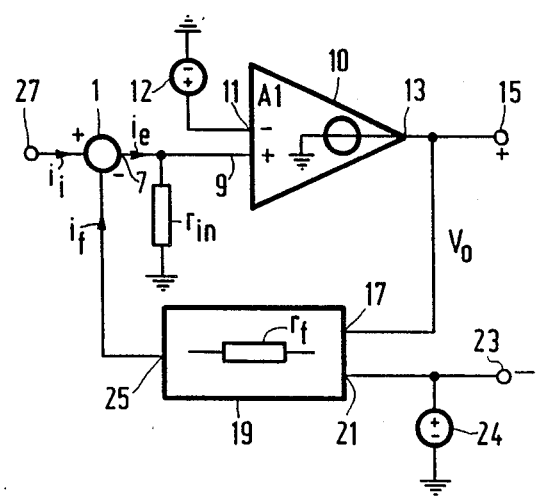
FIG. 1A is a block-schematic diagram of a known negatively fed back transimpedance amplifier.

FIG. 1A shows the known negatively fed back transimpedance amplifier having an input 27 to which an input circuit $i_i$ is applied and which is connected by means of a current subtract circuit 1 to a non-inverting input 9, of a voltage amplifier 10, which input 9 is connected to ground by means of an input resistor $r_{in}$, and has a very high input impedance. An inverting input 11 of the voltage amplifier 10 is connected to ground via a reference voltage source 12. A current $i_e$ obtained from an output 7 of the current subtract circuit 1 produces a voltage across the input resistor $r_{in}$, which voltage is subsequently amplified by the voltage amplifier 10. An output 13 of the voltage amplifier 10 is connected to an output 15 of the negatively fed back transimpedance amplifier. The output 15 of the negatively fed back transimpedance amplifier is also connected to a first input 17 of a negative current feedback circuit comprising a tansconductance amplifier 19, a second iput 21 of which circuit is connected to a reference potential terminal 23, which is connected to ground via a reference voltage source 24. The transconductance, i.e. the transfer ratio between output current $i_f$ and input voltage $v_o$ of the transconductance amplifier 19, is determined by a resistor $r_f$ incorporated therein. An output 25 of the transconductance amplifier 19 is connected to the current subtract circuit 1.

The transfer function of the negatively fed back transimpedance amplifier of FIG. 1A is given by the equation $$\frac{v_o}{i_i} = \frac{A1 \cdot r_{in}}{1 + A1 \cdot k} \text{ in which } k = \frac{r_{in}}{r_f} \quad (1)$$

in which A1 is the transfer function of the voltage amplifier 10. If the modulus of A1·k is much larger than one, the right-hand member is approximately equal to $r_{in} \cdot 1/k$. In the reverse case, the right-hand member is approximately equal to $r_{in} \cdot A1$. Stability problems arise when the phase shift of A1·k is close to $-180°$ for the frequency where the modulus of A1 is approximately as large as the modulus of 1/k. A phase margin of at least 45° between the phase shift of A1·k if its modulus is equal to one, and a phase shift of $-180°$ is considered to be desirable for a satifactory stability.

Figure 1B:
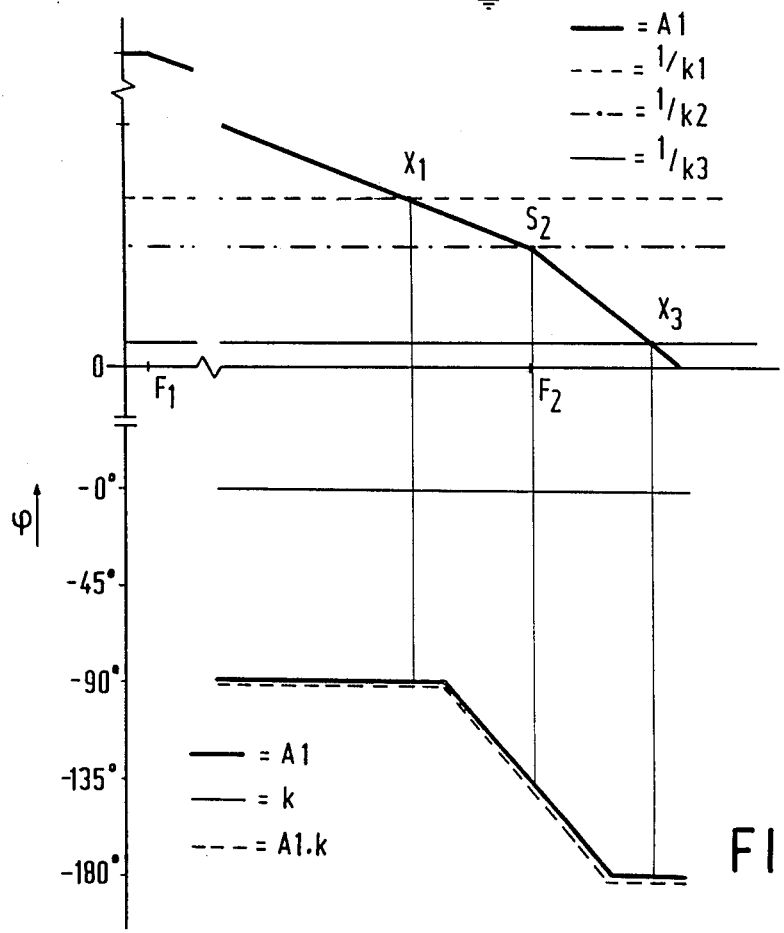
FIG. 1B shows an associated possible modulus and phase Bode diagram.

In FIG. 1B, the factor $r_{in}$ is omitted for the sake of simplicity. In the upper half of this Figure, a fat solid line diagrammatically shows the modulus of the transfer function A1 plotted against the frequency. The modulus of the transfer function A1 has a first-order decrease above a first frequency F1, that is to say, the slope of the amplitude characteristic associated with the transfer function A1 changes over in the modulus bode diagram from a slope of 0 dB per decade to a slope of $-20$ dB per decade. The modulus of the transfer function A1 has a second-order decrease above a second frequency F2, that is to say, the slope of $-20$ dB per decase in this amplitude characteristic changes over to a slope of $-40$ dB per decade. The Figure also shows the modulus of 1/k for three different values k1, k2 and k3 of k by means of a broken line, a dot-and-dash line and a thin solid line, respectively, plotted against the frequency. In the lower half of FIG. 1B, a fat solid line diagrammatically shows the phase shift of A1, a thin solid line shows k and a broken line shows the product A1·k plotted against the frequency, which plots of k and the product A1·k are independently of the modulus of k. If the value k1 is chosen for k, the bandwidth of the negatively fed back transimpedance amplifier is limited to a frequency which is determined by the abscissa of the point of intersection X1 between the amplitude characteristic of A1 and the amplitude characteristic of 1/k1 in the modulus Bode diagram. As is apparent from the phase Bode diagram, there is a phase margin of approximately 90° so that no stability problems will arise. The bandwidth is, however, smaller than is possible. If the value k2 is chosen for k, the bandwidth of the negatively fed back transimpedance amplifier is increased with respect to the bandwidth associated with the value k1 to the frequency F2 which is equal to the abscissa of the point of intersection S2 between the amplitude characteristic of A1 and the amplitude characteristic of 1/k2 in the upper half of FIG. 1B. As is apparent from the lower half of FIG. 1B, the phase margin is, however, reduced to approximately 45°, which, as stated, is equal to the minimum desirable phase margin. Finally, if the value k3 is chosen for k, the bandwidth is still further increased to a frequency which is determined by the abscissa of the point of intersection X3 between the amplitude characteristic of A1 and the amplitude characteristic of 1/k3 in the upper half of FIG. 1B, but, as can be seen in the lower half of FIG. 1B, the phase margin is reduced to approximately 0° so that the negatively fed back transimpedance amplifier has become insufficiently stable. Thus it appears that for a given amplitude characteristic of the transimpedance amplifier which is not negatively fed back the bandwidth of the known negatively fed back transimpedance amplifier cannot be chosen to be larger than the second frequency F2 in the transfer function of the transimpedance amplifier which is not negatively fed back, because stability problems arise above this frequency. For considerations of design, this close relationship between bandwidth and stability is undesirable. It also appears that this largest bandwidth is achieved, if k is chosen to be such that the amplitude characteristic of 1/k intersects the amplitude characteristic A1 exactly for this second frequency F2.

Figure 2A:
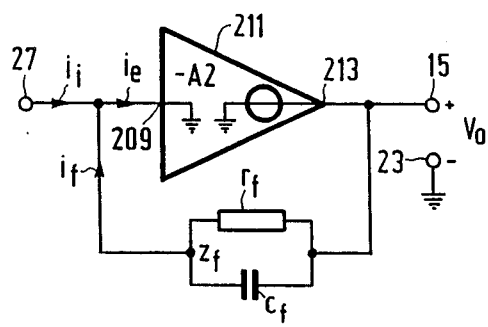
FIG. 2A is a block-schematic diagram of a negatively fed back transimpedance amplifier for use in an amplifier arrangement according to the invention.

FIG. 2A is a block-schematic diagram of a negatively fed back transimpedance amplifier for use in an amplifier arrangement according to the invention. An input 209 of a transimpedance amplifier 211 is connected to the input 27 of the negatively fed back transimpedance amplifier. An output 213 of the transimpedance amplifier 211 is connected to the output 15 of the negatively fed back transimpedance amplifier and is connected to the input 209 of the transimpedance amplifier 211 via a negative current feedback circuit comprising a parallel arrangement of a resistor $r_f$ and a capacitor $C_f$. A first difference with the transimpedance amplifier of FIG. 1A is that the cut-off frequency caused by the parasitic capacitances is much higher due to the low input impedance of the transimpedance amplifier 211 of FIG. 2A. A second difference is that this low input impedance no longer makes it necessary for the negative current feedback circuit to have a high output impedance, as with the transconductance amplifier 19 of FIG. 1A. A third difference is that the transfer function modulus of the negative current feedback circuit of FIG. 2A has a first-order increase above a frequency F3 2hich is determined by the resistor $r_f$ and the capacitor $C_f$. A fourth difference is that the current $i_e$ is no longer converted into a voltage by means of an input resistor $r_{in}$ which voltage is subsequently amplified by a voltage amplifier, but is directly amplified by a current-voltage amplifier.

The transfer function of this negatively fed back transimpedance amplifier is given by the equation $$\frac{v_o}{i_i} = \frac{-A2}{1 + A2 \cdot k}, \text{ with } k = \frac{1}{Z_f} \quad (2)$$

in which $Z_f$ is the impedance of the parallel arrangement of the resistor $r_f$ and the capacitor $C_f$ in which $A_2$ is the transfer function of the transimpedance amplifier 211.

Figure 2B:
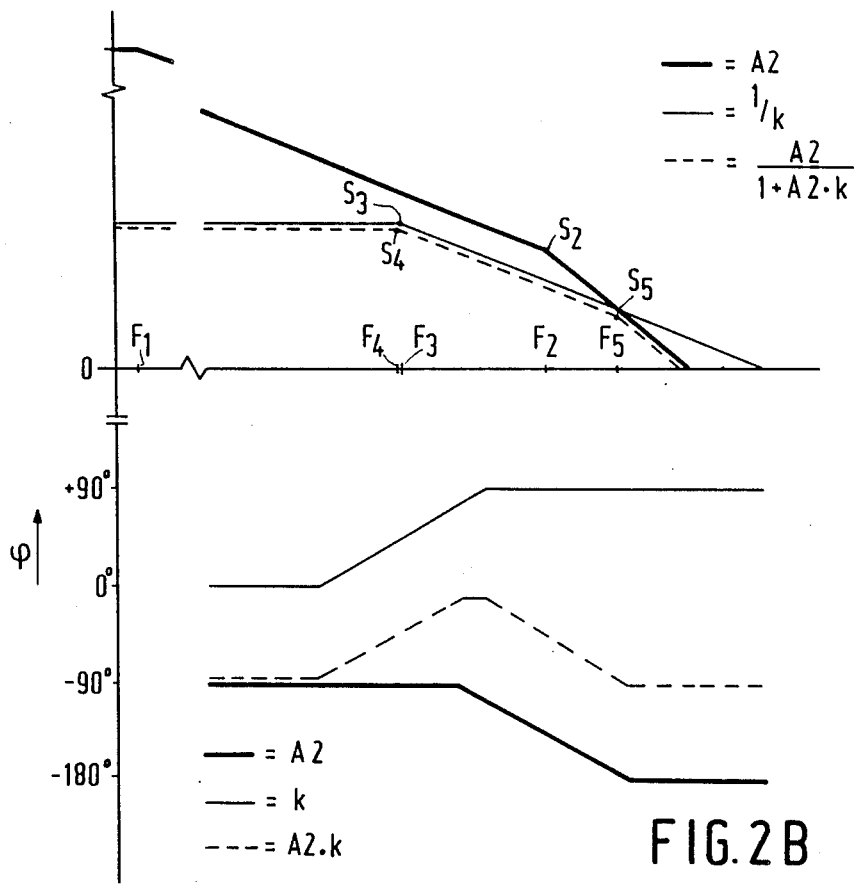
FIG. 2B shows an associated possible modulus and phase Bode diagram.

In the upper half of FIG. 2B, a fat solid line diagrammatically shows the modulus of A2 plotted against the frequency, in which a first-order decrease again occurs above a first frequency of F1 and a second-order decrease occurs above a second frequency F2. The modulus of 1/k is diagrammatically shown by means of a thin solid line plotted against the frequency. The transfer function of k has a first-order increase, and hence the transfer function of 1/k has a first-order decrease above a third frequency F3 which in this example is chosen to be smaller than the second frequency F2. The transfer function modulus of the negatively fed back transimpedance amplifier, in accordance with the right-hand member of equation (2), is plotted against the frequency by means of a broken line. This transfer function modulus has a first-order decrease above a fourth frequency F4 which is approximately equal to the third frequency F3, so that the bandwidth of the negatively fed back transimpedance amplifier is equal to this fourth frequency F4. This first-order decrease changes over to the second-order decrease above a fifth frequency F5 which is determined by the abscissa of the point of intersection S5 between the amplitude characteristic of A2 and the amplitude characteristic of 1/k. This frequency F5 is larger than the second frequency F2 in the transfer function of the transimpedance amplifier.

In the lower half of FIG. 2B, a fat solid line diagrammatically shows the phase shift of A2, a thin solid line shows the phase shift of k, and a broken line shows the phase shift of the product A2·k plotted against the frequency. As is shown in this lower half, the phase shift for each frequency, notably for the frequency F5, is not larger than 90° in this example in which the frequency F3 is smaller than the frequency F2, so that the phase margin is amply sufficient, so that stability problems will not occur.

Figure 3A:
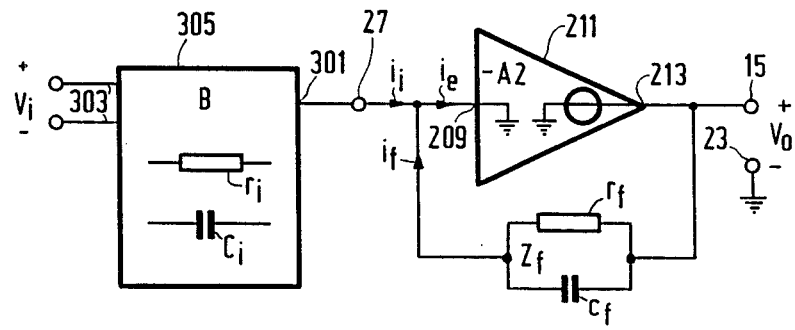
FIG. 3A is a block-schematic diagram of an amplifier arrangement according to the invention, using the example of the negatively fed back transimpedance amplifier of FIG. 2A.

FIG. 3A is a block-schematic diagram of an amplifier arrangement according to the invention in which the transimpedance amplifier 211 shown in FIG. 2A is arranged in cascade with a transadmittance circuit 305. The transadmittance circuit 305 has an input 303 to which an input voltage $v_i$ is applied. The transadmittance of the transadmittance circuit 305, i.e. the transfer function between output current $i_i$ and input voltage $v_i$, is determined by a resistor $r_i$ and a capacitor $C_i$ both incorporated thereion. An output 301 of a transadmittance circuit 305 is connected to the input 27 of the negatively fed back transimpedance amplifier. The transfer function of the amplifier arrangement according to the invention is given by the equation $$\frac{v_o}{v_i} = \frac{-A2 \cdot B}{1 + A2 \cdot k}, \text{ with } k = \frac{1}{Z_f} \quad (3)$$

in which B is the transfer function of the transadmittance circuit 305.

Figure 3B:
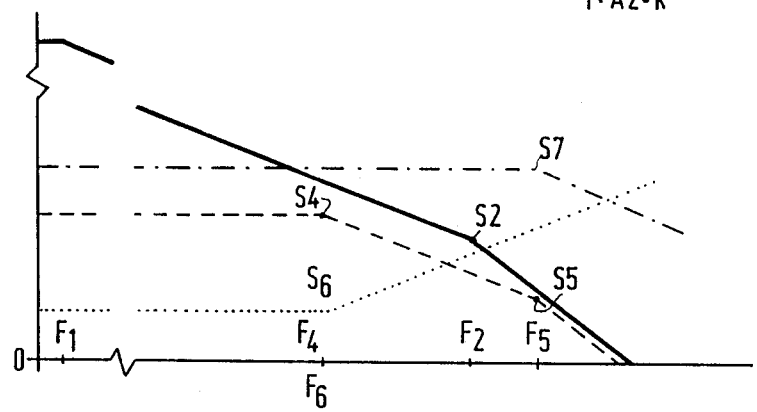
FIG. 3B shows an associated possible modulus Bode diagram, using the example of the negatively fed back transimpedance amplifier of FIG. 2B.

In FIG. 3B, the characteristic curve of the transadmittance amplifier 305 is shown by means of a broken line and the amplitude characteristic of the entire amplifier arrangement is shown by means of a dot-and-dash line. The amplitude characteristic of the transimpedance amplifier A2 and of the negatively fed back transimpedance amplifier are shown by means of a fat solid line and a broken line, respectively, similarly as in the upper half of FIG. 2B.

The transfer function modulus of the transadmittance circuit 305 has a first-order increase above substantially the same frequency as the frequency above which the transfer function modulus of the negatively fed back transimpedance amplifier 211 has a first-order decrease, namely above the frequency F4 which is determined by the abscissa of the point S4 in the upper half of FIG. 2B. This gives rise to an amplitude characteristic for the entire amplifier arrangement as is shown by means of the dot-and-dash line in FIG. 3B. Since the first-order increase of the transfer function modulus of the negatively fed back transimpedance amplifier 211 is compensated by the first-order increase of the transfer function modulus of the transadmittance circuit 305, the amplitude characteristic of the entire amplifier arrangement is flat up to the frequency F5. Above the frequency F5, this amplitude characteristic has a first-order decrease because the second-order decrease of the transfer function modulus of the transimpedance amplifier 211 is only partly compensated by the first-order increase of the transfer function modulus of the transadmittance circuit 305. Since the phase shift of the transadmittance amplifier placed outside the feedback loop is not important for the stability, only the modulus Bode diagram is shown in FIG. 3B.

As is apparent from FIG. 3B, the bandwidth of the entire amplifier arrangement is now equal to the frequency F5 and is thus larger than the second frequency F2 in the transfer function of the transimpedance amplifier which is not negatively fed back. Moreover, there is no longer any coupling between bandwidth and stability.

Figure 3C:
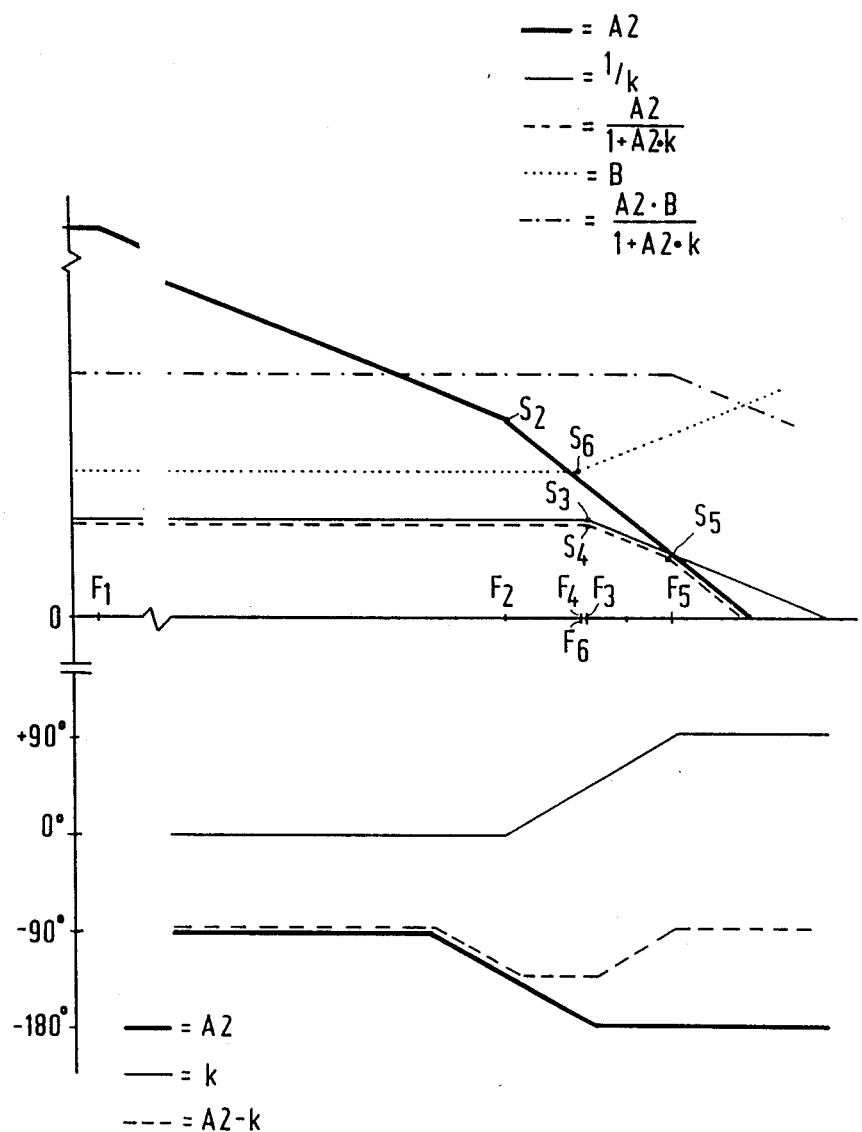
FIG. 3C shows another possible modulus and phase Bode diagram associated with the amplifier arrangement according to the invention as exemplified in FIG. 3A.

In the example shown in FIG. 3C the frequency F3 in the transfer function of the negative current feedback circuit is chosen to be larger than the frequency F2 in the transfer function of the transimpedance amplifier, more specificaly five times F2. In the upper half of FIG. 3C, the amplitude characteristics of the transfer function A2 of the transimpedance amplifier 211 are diagrammatically shown by means of a fat solid line, while the transfer function $Z_f = 1/k$ of the negative current feedback circuit is shown by means of a thin solid line, and the transfer function of the negatively fed back transimpedance amplifier is shown by means of a broken line. A dotted line show the amplitude characteristic of the transfer function B of the transadmittance circuit 305 and a dot-and-dash line shows the amplitude characteristic of the transfer function of the entire amplifier arrangement according to the invention. It is to be noted that the examples shown in FIGS. 1B, 2B, 3B and 3C are idealized in the sense that the effects of third and higher order poles in the transfer function of the transimpedance amplifier have not been taken into account.

In the lower half of FIG. 3C, the phase characteristic of A2 is shown by means of a fat solid line, the characteristic of k is shown by means of a thin solid line, and of A2·k by means of a broken line. Since the frequency F3 in this example is chosen to be larger than the frequency F2, in which F3 = 5×F2, the phase shift initially increases from a phase shift of 90° to a phas shift of 135° and then decreases to a phase shift of 90° if the frequency domain is traversed from low to high, which is in contrast to the situation shown in FIG. 2B in which F3 was smaller than F2 and in which the phase shift initially decreased from a phase shift of 90° and then increased again. Consequently, stability considerations lead to a certain preference to choose the frequency F3 to be smaller than the frequency F2, and certainly so if the frequency F5 is only slightly larger than the frequency F3 so that the phase margin is smaller than 90° in the situation as shown in this lower half of FIG. 3C. It is true that this shown phase margin of approximately 90° is substantially twice the minimum desirable phase margin of 45° but, as stated hereinbefore, the detrimental effects of the further transition frequencies which are larger than the frequency F2 and which occur in the transfer function of the transadmittance amplifier have not been taken into account in the drawing.

Figure 4A:
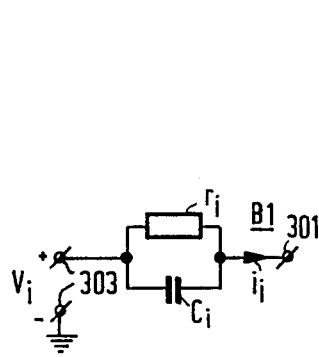
FIG. 4A shows a simple transadmittance circuit for use in an amplifier arrangement according to the invention.

FIG. 4A shows a simple transadmittance circuit for use in an amplifier arrangement according to the invention, which comprises only a parallel arrangement of a resistor $r_i$ and a capacitor $C_i$ between the input 303 and the output 301. In order to render the frequency F6 equal to the frequency F4 as much as possible, the sixth frequency F6 in the transfer function of this parallel arrangement can be made adjustable by using a resistor of the variable type and/or by using a capacitor of the variable type.

Figure 4B:
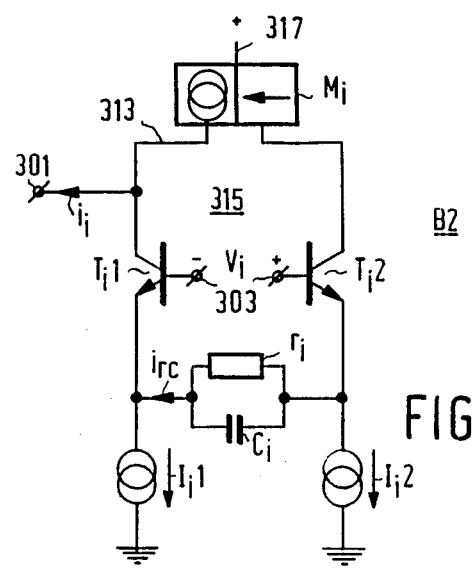
FIG. 4B shows a transmittance amplifier for use in an amplifier arrangement according to the invention.

FIG. 4B shows a transadmittance amplifier for use in an amplifier arrangement according to the invention. Its advantage is that the output impedance is higher than in a parallel arrangement only, which is shown in FIG. 4A, so that a more accurate transfer ratio can be realized. The transadmittance amplifier 315 is constituted by a differential amplifier having two transistors $T_i1$ and $T_i2$ whose bases constitutes the inverting and the non-inverting inputs 303, respectively, and whose emitters are connected to ground by means of a first current source $I_i1$ and a second current source $I_i2$, respectively. The resistor $r_i$ and the capacitor $C_i$ are parallel arranged between these emitters. The collector of the transistor $T_i1$ is directly coupled to the output 301 and the collector of the transistor $T_i2$ is connected to the output 301 via a current mirror circuit $M_i$. A common terminal 317 of the current mirror circuit $M_i$ is connected to a power supply voltage.

The operation is as follows. The input voltage $v_i$ produces a current $i_{rC}$ through the parallel arrangement. This current flows through the transistor $T_i1$ from the emitter to the collector and then to the output 301. The current $i_{rC}$ also flows through the transistor $T_i2$ from the collector to the emitter. The current through the transistor $T_i21$ is mirrored by the current mirror circuit $M_i$ and thus flows through its output 313 to the output 301 so that the output current $i_i$ is equal to $2*i_{rC}$.

Figure 4C:
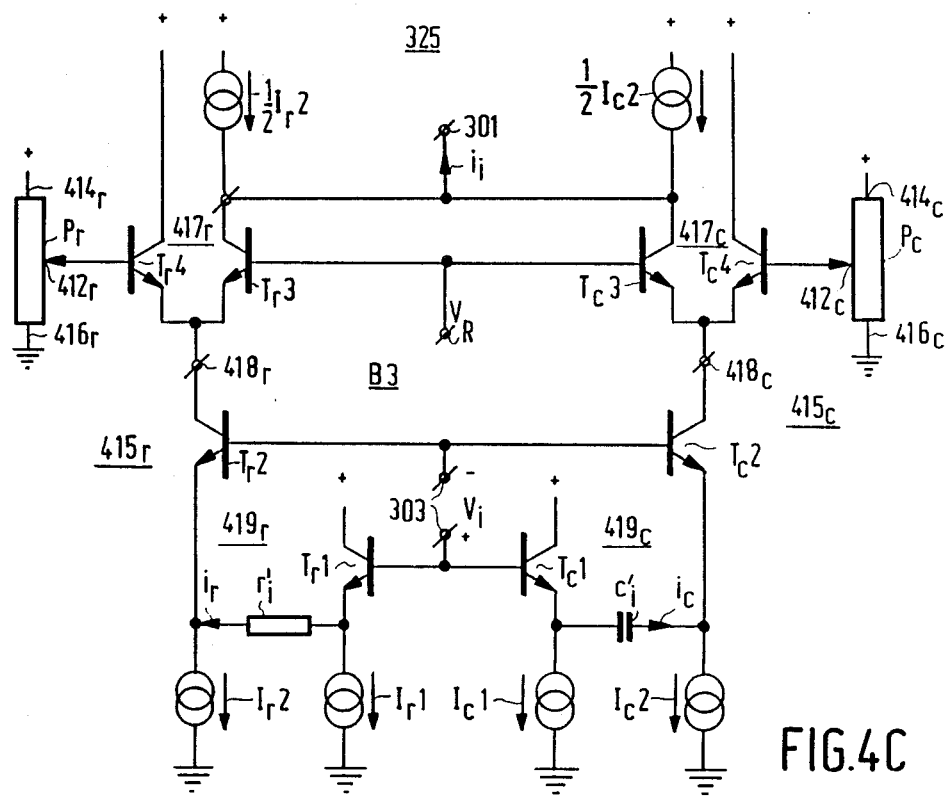
FIG. 4C shows a transadmittance amplifier comprising simple adjusting circuits for adjusting the sixth frequency F6 in its transfer function for use in an amplifier arrangement according to the invention.

FIG. 4C shows a transadmittance amplifier for use in an amplifier arrangement according to the invention in which adjusting circuits are incorporated, with which both the gain of the amplifier arrangement and the frequency F6 above which the transfer function of the transadmittance amplifier has a first-order increase are adjustable. The transadmittance amplifier comprises the parallel arrangement of a transconductance amplifier $415_r$ and a transsusceptance amplifier $415_C$. The transconductance amplifier $415_r$ has a first adjusting circuit $417_r$ by means of which it is determined which part of a current $i_r$ through a fixed resistor $r_i'$ in the transconductance amplifier, which current $i_r$ is dependent on the input voltage $v_i$ at the input 303 of the transadmittance amplifier 325 and on the fixed resistor $r_i'$, is passed to the current output 301 of the transadmittance amplifier B. The transsusceptance amplifier $415_C$ comprises a second adjusting circuit $417_C$ by means of which it is determined which part of a current $i_C$ through a fixed capacitor $C_i'$ in the transsusceptance amplifier, which current $i_C$ is dependent on the input voltage $v_i$ at the input 303 of the transadmittance amplifier 305 and on the fixed capacitor $C_i'$, is passed to the current output 301 of the transadmittance amplifier B. A part $419_r$ of the transconductance amplifier $415_r$ for the first adjusting circuit $417_r$ and a part $419_C$ of the transsusceptance amplifier $415_C$ for the second adjusting circuit $417_C$ are substantially identical to the transadmittance amplifier 315 of FIG. 4B, with the difference that in these parts $419_r$ and $419_C$ the current mirror circuits are absent and of course no capacitor is incorporated in the part $419_r$ of the transconductance amplifier $415_r$ and no resistor is incorporated in the part $419_C$ of the transsusceptance amplifier $415_C$. The adjusting circuits $417_r$ and $417_C$ are identical. For the sake of simplicity, only the transconductance amplifier $415_r$ will be described. The description of the transsusceptance amplifier $415_C$ emanates therefrom by replacing the caption "r" by "C" and by reading "capacitor $C_i'$" instead of "resistor $r_i'$", throughout the next paragraph.

The transconductance amplifier $415_r$ is constituted by the part $419_r$ incorporating a differential amplifier having two transistors $T_r1$ and $T_r2$ whose bases constitute the non-inverting and the inverting inputs 303 and whose emitters are connected to ground by a first current source $I_r1$ and a second current $I_r2$, respectively. The resistor $r_i'$ is arranged between these emitters. The collector of the transistor $T_r1$ is connected to a power supply voltage. The collector of the transistor $T_r2$ is connected to an input $418_r$ of the first adjusting circuit $417_r$, which input in this first adjusting circuit $417_r$ is connected to the emitters of two transistor $T_r3$ and $T_r4$. The base of the transistor $T_r3$ is connected to a reference voltage $V_R$ and its collector is connected to the current output 301 of the transadmittance amplifier. The collector of the transistor $T_r4$ is connected to a power supply voltage. A current source supplying a current of $0.5*i_r2$ is connected between a power supply voltage and the output 301. The base of transistor $T_r4$ is connected to the wiping contact $412_r$ of an adjusting resistor $p_r$, a first fixed contact $414_r$ of which is connected to a power supply voltage and a second fixed contact $416_r$ of which is connected to ground.

While considering only the signal voltages and signal currents and ignoring base currents of transistors for the sake of simplicity, the transconductance amplifier operates as follows. The input voltage $v_i$ at the input 303 produces a current $i_r$ through the fixed resistor $r_i'$. This current also flows through the collector of the transistor $T_r2$. If the voltage, which can be adjusted by means of the adjusting resistor $p_r$, at the base of the transistor $T_r4$ is equal to the reference voltage $V_R$ at the base of the transistor $T_r3$, equal halves of the current $i_r$ flow through the transistors $T_r3$ and $T_r4$ so that the output current $i_i$ through the output 301 of the transadmittance amplifier B is equal to $0.5*i_r$. If the voltage, which can be adjusted by means of the adjusting resistor $p_r$, at the base of the transistor $T_r4$ increases, the collector current of the transistor $T_r4$ also increases and the collector current of the transistor $T_r3$ proportionally decreases so that a decreasing portion of the current $i_r$ flows through the output 301. If, finally, the voltage at the base of the transistor $T_r4$ is such that no current at all flows through the transistor $T_r3$, the output current $i_i$ has become equal to 0. If, in the opposite case, the voltage, which can be adjusted by means of the adjusting resistor $p_r$, at the base of the transistor $T_r4$ decreases with respect to the reference voltage $V_R$ at the base of the transistor $T_r3$, an increasing portion of the current $i_r$ will flow through the output 301.

Figure 4D:
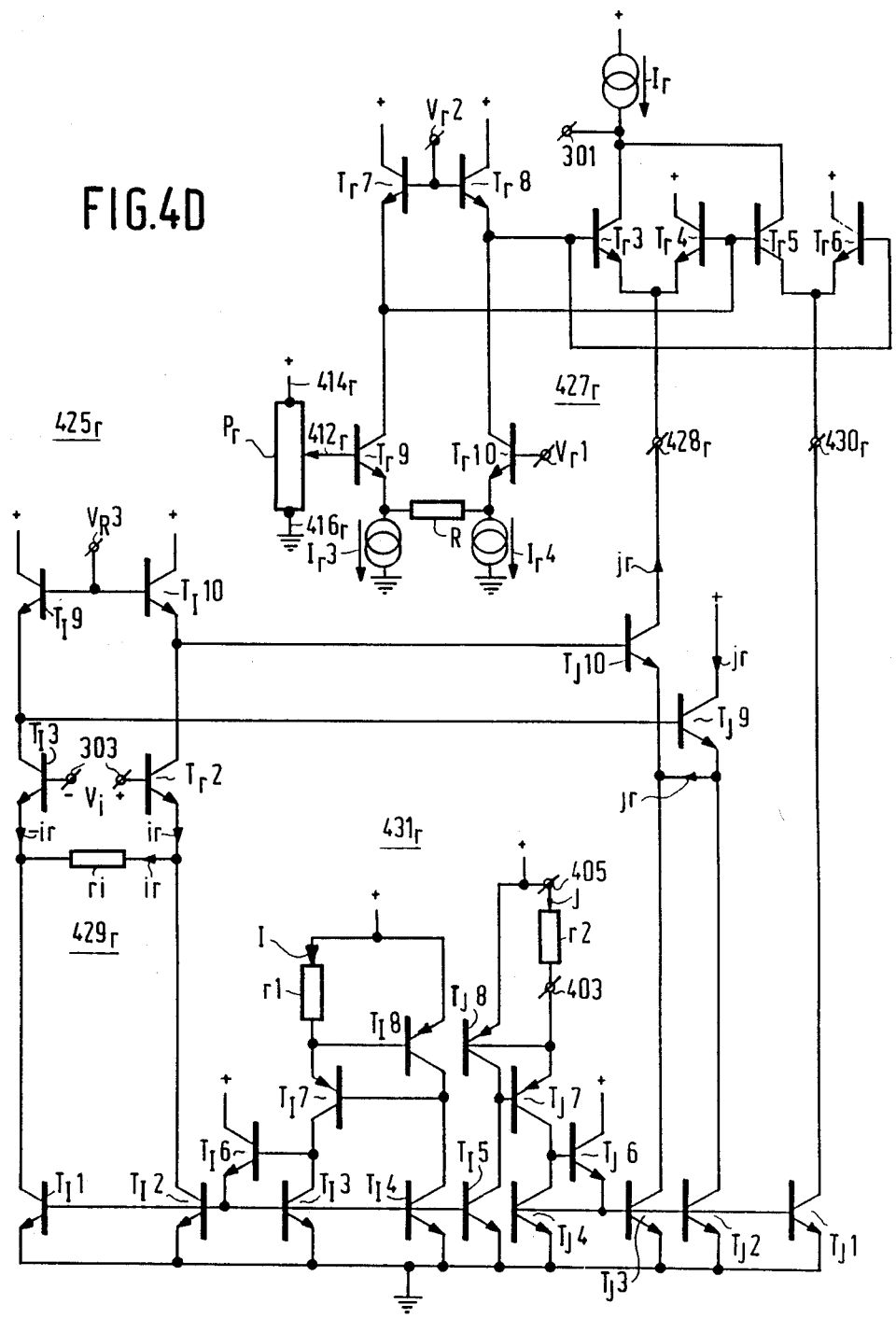
FIG. 4D shows a transconductance amplifier comprising an adjusting circuit for adjusting the sixth frequency F6 in the transfer function of the transadmittance amplifier and of a current multiplication circuit for use in a transadmittance amplifier in an amplifier arrangement according to the invention.

FIG. 4D shows a transconductance amplifier $425_r$ with which, similarly as in FIG. 4C, a transsusceptance amplifier can be arranged in parallel in order to obtain a transadmittance amplifier for an amplifier arrangement according to the invention. The transconductance amplifier $425_r$ comprises an adjusting circuit $427_r$, a proper transconductance amplifier $429_r$ and a current multiplication circuit $431_r$.

When integrating the amplifier arrangement according to the invention, the fixed resistor $r_i'$ may be an integrated (internal) resistor, while the negative feedback resistor $r_f$ of the transimpedance amplifier may be an external resistor. The result is that the temperature dependence of these two resistors will differ, so that the gain of the amplifier arrangement will vary. The effective transconductance resistor may be given the same temperature dependence as the external negative feedback resistor $r_f$ by multiplying the current through the internal resistor $r_i'$ by a fraction whose numerator is determined by an internal resistor and whose denominator is determined by an external resistor. This multiplication may be performed, for example, in the manner described in IEEE Journal of Solid-State Circuits August 1982, pages 713-715.

An adapted and favorable embodiment for use in an amplifier arrangement according to the invention of such a current multiplication circuit is the circuit $431_r$ shown in FIG. 4D. The internal resistor is a resistor $r_1$ and the external resistor is a resistor $r_2$. The current multiplication circuit $431_r$ is composed as follows. Five transistors $T_I1$ to $T_I5$ are incorporated in a first current mirror, that is to say, their bases are interconnected and their emitters are interconnected. The transistor $T_I3$ of these transistors $T_I1$ to $T_I5$ functions as an input transistor because its collector is connected to the base via a transistor $T_I6$. The base of this transistor $T_I6$ is connected to the collector of the input transistor $T_I3$, its collector is connected to a positive power supply terminal and its emitter is connected to the bases of the transistors $T_I1$ to $T_I5$ and supplies base currents for these transistors.

Similarly, four transistors $T_J1$ to $T_J4$ are incorporated in a second current mirror. The transistor $T_J4$ of these transistors $T_J1$ to $T_J4$ functions as an input transistor, because its collector is connected to the base via a transistor $T_J6$. The emitters of the two current mirrors are connected to ground. If desired, these emitters may be connected to ground via suitably chosen resistors.

The collector of the input transistor $T_I3$ is also connected to the collector of a transistor $T_I7$ whose emitter is connected to the base of a transistor $T_I8$ and, via the resistor $r_1$, to a positive power supply terminal to which also the emitter of the transistor $T_I8$ is connected. The collector of the transistor $T_I8$ is connected to the collector of the transistor $T_J4$ and to the base of the transistor $T_I7$.

The collector of the input transistor $T_J4$ is also connected to the collector of a transistor $T_J7$ whose emitter is connected to the base of a transistor $T_J8$ and to a terminal 403. The emitter of the transistor $T_J8$ is connected to a positive power supply terminal and to a terminal 405. The resistor $r_2$ is arranged between the terminals 403 and 405. The collector of the transistor $T_J8$ is connected to the collector of the transistor $T_I5$ and to the base of the transistor $T_J7$.

The current multiplication circuit $431_r$ operates as follows. Since the transistors $T_J4$ and $T_I5$ are incorporated in a current mirror, the transistors $T_J8$ and $T_J8$ also convey the same current so that also the base-emitter voltages of these transistors $T_I8$ and $T_J8$ must be equal. Since the resistors $r_1$ and $r_2$ are arranged in parallel with these base-emitter junctions, the ratio between the current I through the resistor $r_1$ and the current J through the resistor $r_2$ is exclusively dependent on the ratio between the resistances of these resistors. The currents I and J flow via the transistors $T_I7$ through the input transistors $T_I3$ and $T_J4$ of the respective current mirrors, resulting in all transistors $T_I1$ to $T_I5$ conveying a current I and all transistors $T_J1$ to $T_J4$ conveying a current J.

The transistors $T_r1$ and $T_r2$ are comparable with the current sources $I_r1$ and $I_r2$ in FIG. 4C and supply adjusting currents which are equal to the current I at the transistors $T_r1$ and $T_r2$, respectively, which, together with the resistor $r_i'$, constitute the proper transconductance amplifier $429_r$, which is comparable with the part $419_r$ of the transconductance amplifier $415_r$ of FIG. 4C. The collector of the transistor $T_r1$ is connected to the emitter of a transistor $T_I9$ whose base is connected to a reference voltage terminal $V_{R3}$ and whose collector is connected to the positive power supply terminal. Similarly, the collector of the transistor $T_r2$ us connected to the emitter of a transistor $T_I10$ whose base is connected to the reference voltage terminal $V_{R3}$ and whose collector is connected to the positive power supply terminal. The emitters of the transistor $T_I9$ and $T_I10$ are also connected to the bases of the transistors $T_J9$ and $T_J10$, respectively, whose emitters are interconnected and are connected to the collectors of the transistors $T_J2$ and $T_J3$, respectively, so that an adjusting current J flows through these transistors $T_J9$ and $T_J10$. The collector of the transistor $T_J10$ is connected to an input $428_r$ of the adjusting circuit $427_r$. The collector of the transistor $T_J9$ is connected to a power supply voltage. The collector of the transistor $T_J1$ is connected to a terminal $430_r$ of the adjusting circuit $427_r$.

The current multiplication of the current $i_r$ through the resistor $r_i'$ by the factor $r_1/r_2 = J/I$ is effected as follows. Since the bases of the transistor $T_I9$ and $T_I10$ are connected to the reference voltage terminal $V_{R3}$ and thus have a fixed potential, the emitter potentials of these transistors are directly dependent on the collector currents through these transistors $T_I9$ and $T_I10$ in conformity with the known exponential relationship $V_{BE} = (kT/q)\ast\ln (I_C/I_S)$ between the base-emitter voltage $V_{BE}$ and the collector current $I_C$ of a bipolar transistor. Since the emitter potentials of the transistor $T_I9$ and $T_I10$ are equal, it also holds that, in conformity with the same exponential relationship, the collector currents through these transistors are dependent on the base potentials of these transistors which are equal to the emitter potentials of the transistors $T_I9$ and $T_I10$, respectively. The exponential relationship implies that a variation $u_B$ in the emitter potentials of the transistors $T_I9$ and $T_I10$ and hence in the base potentials of the transistors $T_J8$ and $T_J10$, respectively, is directly proportional to $i_r/I$, and that a variation $j_r$ in the collector currents of the transistors $T_J9$ and $T_J10$ is directly proportional to $J.u_B$ so that $j_r/i_r$ is equal to $J/I$.

Since $i_r = v_i/r_i'$ it follows that $$j_r = \frac{r_1}{r_2} \cdot \frac{v_i}{r_i} \qquad (4)$$

As the temperature coefficients of the internal resistors $r_1$ and $r_i'$ eliminate each other, the temperature dependence of the current $j_r$ is exclusively determined by the external resistor $r_2$. The transfer ratio of the amplifier arrangement according to the invention is now also better known because the spreads in the resistances of the internal resistors $r_1$ and $r_i'$ eliminate each other so that the spread in the transfer ratio of the amplifier arrangement will be substantially exclusively dependent on the spread in the external resistor $r_2$ and $r_f$, which is generally much smaller or can be made smaller than the spread in internal resistors. The latter advantage is particularly important if, unlike as is shown in the Figure, the transconductance of the transconductance amplifier cannot be adjusted by means of an adjusting circuit.

The adjusting circuit $427_r$ fulfills the same task as the adjusting circuit $417_r$ of FIG. 4C, but compared with this circuit, it has the advantages that a movement of the wiper $412_r$ of the adjusting resistor $p_r$ brings about a more proportional change in the output current $i_l$ and that exclusively the value of the signal current $i_l$ is adapted by means of the adjusting resistor $p_r$ and not the bias current on which this signal current is a variation.

The adjusting circuit $427_r$ is constructed as follows. The input $428_r$ through which the current $j_r$ flows and the terminal $430_r$ of the adjusting circuit $427_r$ through which the current J flows are connected to two cross-coupled differential amplifiers each comprising the transistors $T_r3$, $T_r4$ and $T_r5$, $T_r6$, respectively. The through-connected emitters of the transistors $T_r3$, $T_r4$ are connected to the input $428_r$, and the through-connected emitters of the transistors $T_r5$, $T_r6$ are connected to the terminal $430_r$. The collector of the transistor $T_r3$ is connected to the output 301 of the transconductor amplifier $425_r$ and to the collector of the transistor $T_r5$ and is connected to a power supply voltage via a current source $J_r$. Like the collector of the transistor $T_r6$, the collector of the transistor $T_r4$ is connected to the power supply terminal.

The inputs of these two cross-coupled differential amplifiers, which inputs are constituted by the through-connected bases of the transistors $T_r3$ and $T_r6$ and $T_r4$ and $T_r5$, respectively, are each connected to a separate output of a further differential amplifier degenerated by a resistor R and comprising two transistors $T_r9$, $T_r10$. A first input of this further degenerate differential amplifier, which input is constituted by the base of the transistor $T_r9$, is connected to the wiping contact $412_r$ of the adjusting resistor $p_r$ and a second input constituted by the base of the transistor $T_r10$ is connected to a reference voltage terminal $V_{R1}$. The emitter of the transistor $T_r9$ is connected to ground via a current source $I_r3$ and is connected to the emitter of the transistor $T_r10$ via the resistor R, the latter emitter being also connected to ground via a current source $I_r4$. The collector of the transistor $T_r9$ is connected to the base of the transistor $T_r4$ and to the emitter of a transistor $T_r7$. The collector of the transistor $T_r10$ is connected to the base of the transistor $T_r3$ and to the emitter of a transistor $T_r8$. The bases of the transistors $T_r7$ and $T_r8$ are connected to a reference voltage terminal $V_{R2}$ and the collectors of these transistors are connected to a positive power supply terminal.

The adjusting circuit $427_r$ operates as follows. If the voltage, which can be adjusted by means of the adjusting resistor $p_r$, at the base of the transistor $t_r9$ is equal to the reference voltage $V_{R1}$ at the base of the transistor $T_r10$, identical currents flow through the collectors of these transistors, which currents produce identical voltage drops across the transistors $T_r7$ and $T_r8$, respectively, so that the base voltages of the transistors $T_r3$ and $T_r6$ are equal to the base voltages of the transistors $T_r4$ and $T_r5$ resulting in identical halves of the signal current $j_r$ flowing through the transistors $T_r3$ and $T_r4$ so that the output signal current is equal to $0.5*j_r$. If the voltage, which can be adjusted by means of the adjusting resistor $p_r$, at the base of the transistor $T_r9$ increases with respect to the reference voltage $V_{R1}$, the collector current of the transistor $T_r10$ proportionally decreases so that an increasing voltage difference is produced between the bases of the transistors $T_r3$ and $T_r6$ and the bases of the transistors $T_r4$ and $T_r5$, so that the part of the signal current $j_r$ flowing through the output 301 increases. If, in the opposite case, the voltage, which can be adjusted by means of the adjusting resistor $p_r$, at the base of the transistor $T_r9$ decreases with respect to the reference voltage $V_{R1}$, the part of the signal current $j_r$ flowing through the output 301 decreases accordingly.

Figure 5A:
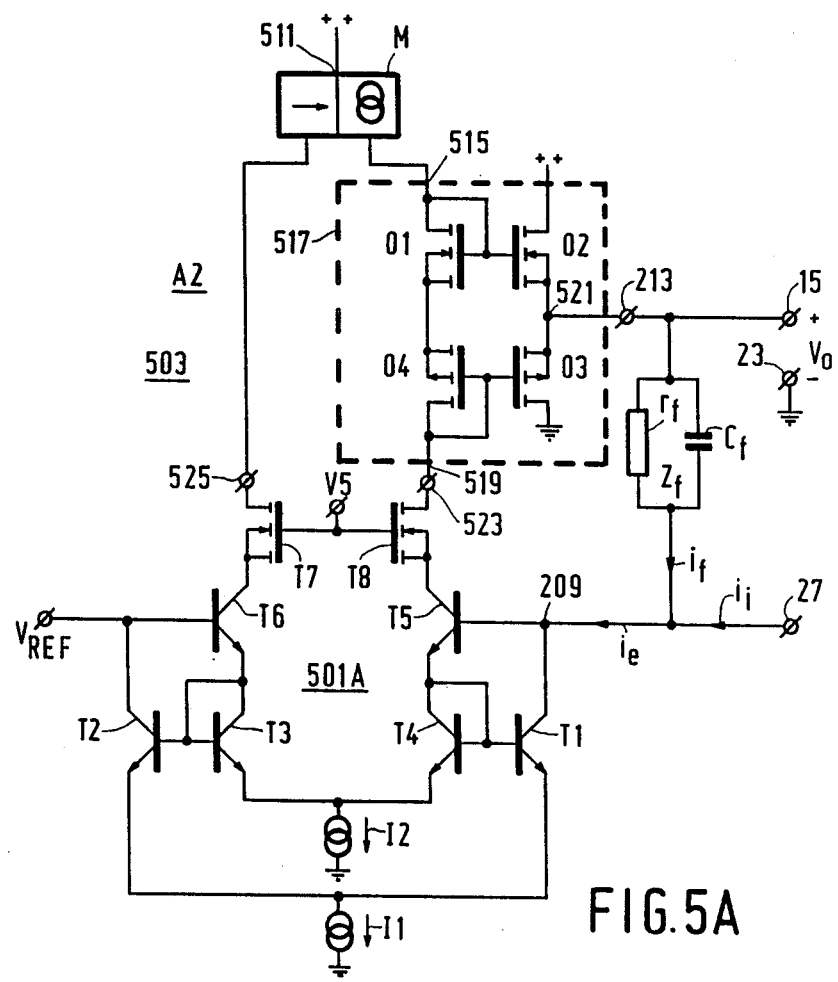
FIG. 5 shows an negatively fed back transimpedance amplifier with a first embodiment of an input stage thereof for use in an amplifier arrangement according to the invention.
FIG. 5B shows a second embodiment of an input stage for the transimpedance amplifier shown in FIG. 5A.

FIG. 5A shows a negatively fed back transimpedance amplifier 503 in which a first embodiment of an input stage 501A for use in an amplifier arrangement according to the invention. The input 209 of the transimpedance amplifier 503 is connected to the input stage 501A which is provided with a first differential amplifier including a first transistor T1 and a second transistor T2, the emitter of the first transistor T1 being connected to the emitter of the second transistor T2 and to a first current source I1. The collector of the first transistor T1 is connected to the input 209 of the transimpedance amplifier A2 and the collector of the second transistor T2 is connected to a reference voltage $V_{REF}$. The input stage 501A is also provided with a second differential amplifier including a third transistor T3 and a fourth transistor T4, the emitter of the third transistor T3 being connected to the emitter of the fourth transistor T4 and to a second current source I2. The bases of the first transistor T1 and the second transistor T2 are connected to the bases and the collectors of the fourth transistor T4 and the third transistor T3, respectively. The input stage 501A also includes a fifth transistor T5 whose base is connected to the input 209 of the transimpedance amplifier 503, whose emitter is connected to the collector of the fourth transistor T4 and whose collector is connected to the source of a field-effect transistor T8 whose gate is connected to a reference voltage terminal $V_5$ and whose drain is connected to a first output 523 of the input stage 501A. This input stage 501A also includes a sixth transistor T6 whose base is connected to the reference voltage $V_{REF}$, whose emitter is connected to the collector of the third transistor T3 and whose collector is connected to the source of a field-effect transistor T7 whose gate is connected to the reference voltage terminal $V_5$ and whose drain is connected to a second output 525 of the input stage 501A.

The first output 523 of the input stage 501A is connected to a first input 519 of an output stage 517, and the second output 525 of the input stage 501A is coupled via a current mirror circuit M to a second input 515 of the output stage 517 consisting of a push-pull amplifier. A common terminal 511 of the current mirror circuit M is connected to a high positive power supply voltage. The push-pull amplifier 517 is constituted by a first-effect transistor 01 whose gate and drain are connected to the second input 515 of the output stage 517, a second field-effect transistor 02 whose gate is connected to the gate of the first field-effect transistor 01 and whose source is connected to the output 521 of the output stage 517 which is connected to the output 213 of the transimpedance amplifier 503. The drain of the field-effect transistor 02 is connected to the high positive power supply voltage. The push-pull amplifier also includes a third field-effect transistor 03 whose source is connected to the output 521 of the output stage 517 and whose gate is connected to the first input 519 of the output stage 517 and whose drain is connected to ground. Finally, the push-pull amplifier 517 includes a fourth field-effect transistor 04 whose source is connected to the source of the first field-effect transistor 01 and whose gate and drain are connected to the gate of the third field-effect transistor 03. The first and second field effect transistors 01, 02 are of a conductivity type which is opposed to the conductivity type of the third and fourth field effect transistors 03, 04.

While only signal voltages and signal currents will be considered and base currents of transistors will be ignored for the sake of simplicity, the circuit of FIG. 5A operates as follows. Firstly, it will be proven that the described circuit of the transistors T1 to T6 indeed yields a very low input impedance. The current $i_e$ through the input 209 of the transimpedance amplifier A2 flows through the transistor T1 so that a voltage $i_e*r_d$ will be produced across its base-emitter junction, in which $r_d$ is equal to the differential resistance of the transistor T1, i.e. substantially equal to 25 mV/(I1/2) at a temperature of 300 K. The current $i_e$ also flows through the transistor T2 so that a voltage $-i_e*r_d$ will be produced across its base-emitter junction. If I2 is assumed to be equal to m*I1, a current m*$i_e$ flows through the transistors T5, T4 and T3, T6 so that voltages, which are equal to m*$i_e$*$r_d$/m and m*$i_e$*$r_d$/m, will be produced across their respective base-emitter junctions. It follows from the foregoing that a current $i_e$ through the input 209 of the transimpedance amplifier 503 produces a voltage between this input and the terminal of $V_{REF}$, which voltage is equal to 4*$i_e$*$r_d$ so that the input impedance is thus equal to only four times the differential resistance $r_d$.

A current gain which is equal to m is also achieved in the above-mentioned set-up. For a given product of gain and bandwidth of the relevant input stage this, however, means that the bandwidth thereof decreases by the same factor of m. In connection therewith, a value of m which is approximately equal to 2 is preferred.

In the aforementioned possible use of the amplifier arrangement according to the invention as a video output amplifier, the power supply voltage at the power supply terminal 511 of the current mirror circuit M and of the drain of the field-effect transistor 02 will be, for example, 250 V. If the field-effect transistor T7 and T8 were not provided, the collector-base voltages of the transistors T5 and T6 could be more than 200 V in this application so that this would preclude the use of low-voltage transistors. Since the drain-gate junctions of field-effect transistors in a conventional IC process can cope with such a voltage drop to a much better extent, the transistors T7 and T8 are arranged as voltage buffers in the circuit. They may of course be omitted in an application in which much lower voltages occur. If an IC process is used in which bipolar high-voltage transistors are possible, the transistors T7 and T8 can also be omitted in the video output amplifier application and the transistors 01 to 04 may be bipolar transistors.

Figure 5B:
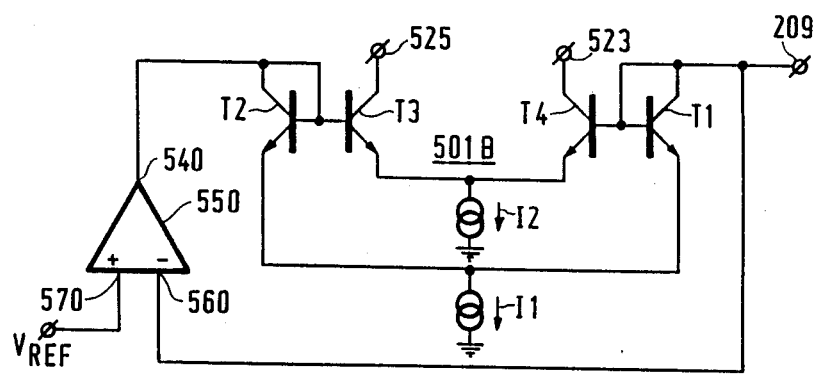

FIG. 5B shows a second embodiment 501B of an input stage of a transimpedance circuit for use in an amplifier arrangement according to the invention. The difference with the input stage 501A of FIG. 5A are that the collectors of the transistors T1 and T2 are connected to their bases, while the collector of the transistor T3 is no longer connected to its base and is directly connected to the second output 525 of the input stage 501B of FIG. 5B, and the collector of transistor T4 is no longer connected to its base and is directly connected to the first output 523 of the input stage 501B. An advantage of this embodiment is that the input impedance is only 2*$r_d$.

In the embodiement of FIG. 5B, the input impedance is still further decreased because the collector of the transistor T2 is no longer connected to the reference voltage terminal $V_{REF}$, but to the output 540 of a differential amplifier 550 whose inverting input 560 is connected to the collector of the transistor T1 and whose non-inverting input 570 is connected to the reference voltage terminal $V_{REF}$. Similarly, the input impedance can also be decreased in the embodiment of the input stage according to FIG. 5A.

It is true that the above-described embodiments of the invention are very favorable embodiments, but they have only been given by way of example and for a better understanding of the invention; the invention is not limited thereto. Thus, any transadmittance circuit will be satisfactory, if its transfer function modulus has a first-order increase above approximately the same frequency as that above which the transfer function modulus of the negative feedback circuit has a first-order increase. If the transadmittance circuit is provided with one or more adjusting circuits, adjusting circuits other than the ones shown in FIGS. 4C and 4D will be satisfactory; the electronic potentiometers shown are only two among a variety of possibilities. Within the scope of the invention, it is alternatively possible to choose a transadmittance circuit having two outputs whose respective output signals are in phase opposition, which outputs are then coupled to an inverting and a non-inverting input, respectively, of the transimpedance amplifier. The current input of the transimpedance amplifier to which the negative feedback current $i_f$ is applied does not necessarily have to coincide with the current input to which the signal current $i_i$ is applied. The transimpedance amplifier according to the invention may also have more outputs, e.q. two outputs one of which is coupled to the negative current feedback circuit and the other of which is coupled to a device (for example, a display tube of a display device) which is controlled by the amplifier arrangement. Throughout the amplifier arrangement according to the invention, it is possible to make a choice of different elements and/or technologies, if a designer were to prefer them, without passing beyond the scope of the invention.

What is claimed is:

1. An amplifier arrangement comprising:
   a transadmittance circuit having an input coupled to an input of the amplifier arrangement, and
   a transimpedance amplifier having an input coupled to an output of the transadmittance circuit and an output coupled to an output of the amplifier arrangement, the transfer function modulus of the transimpedance amplifier having a first-order decrease above a first frequency F1 and a second-order decrease above a second frequency F2, said transimpedance amplifier being negatively fed back by means of a negative current feedback circuit, characterized in that
   the negative current feedback circuit is constituted by a negative feedback impedance whose inverse of the transfer function modulus below the second frequency F2 is smaller than the transfer function modulus of the transimpedance amplifier and which transfer function modulus has a first-order increase above a third frequency F3 so that the transfer function modulus of the negatively fed back transimpedance amplifier has a first-order decrease above a fourth frequency F4 which is substantially equal to the third frequency F3, and a second-order decrease above a fifth frequency F5 which is located above the second frequency F2,
   the transfer function modulus of the transadmittance circuit has a first-order increase above a sixth frequency F6 which is substantially equal to the fourth frequency F4 so that the transfer function modulus of the amplifier arrangement has a first-order decrease above the fifth frequency F5, and
the transimpedance amplifier has a low-ohmic current input with an input impedance whose modulus, at least for frequencies below the fifth frequency F5, is smaller than the modulus of the negative feedback impedance.

2. An amplifier arrangement as claimed in claim 1, characterized in that the second frequency F2 is larger than approximately one-fifth of the fifth frequency F5.

3. An amplifier arrangement as claimed in claim 1 or 2, characterized in that the third frequency F3 is larger than approximately one-fifth of the fifth frequency F5.

4. An amplifier arrangement as claimed in claim 1, characterized in that the third frequency F3 is not larger than the second frequency F2.

5. An amplifier arrangement as claimed in claim 1, characterized in that the negative feedback impedance comprises a parallel arrangement of a resistor and a capacitor.

6. An amplifier arrangement as claimed in claim 1, characterized in that the transadmittance circuit comprises a parallel arrangement of a resistor and a capacitor.

7. An amplifier arrangement as claimed in claim 1, 2, 4 or 5, characterized in that the transadmittance circuit is a transadmittance amplifier which comprises a differential amplifier degenerated by a parallel arrangement of a resistor and a capacitor.

8. An amplifier arrangement as claimed in claim 1, 2, 4 or 5, characterized in that the transadmittance circuit is a transadmittance amplifier which comprises a parallel arrangement of a transconductance amplifier and a transsusceptance amplifier.

9. An amplifier arrangement as claimed in claim 8, characterized in that the transconductance amplifier comprises a differential amplifier degenerated by a resistor and ion that the transsusceptance amplifier comprises a differential amplifier degenerated by a capacitor.

10. An amplifier arrangement as claimed in claim 1, characterized in that the transadmittance circuit comprises adjusting means for adjusting the sixth frequency F6 in the transfer function of the transadmittance amplifier.

11. An integrated amplifier circuit, characterized in that it comprises a transadmittance circuit and/or a transimpedance amplifier suitable for an amplifier arrangement as claimed in claim 1.

12. An amplifier arrangement as claimed in claim 10, characterized in that the adjusting means are constituted by means for adjusting resistance of a resistor and/or capacitance of a capacitor.

13. An amplifier arrangement as claimed in claim 10, characterized in that the adjusting means comprises:
a first adjusting circuit in which it can be determined, by means of a first adjusting resistor, which part of a current dependent on an input voltage at the input of the transadmittance amplifier and on the transconductance of the transconductance amplifier is passed on to a current output of the transadmittance amplifier; and
a second adjusting circuit in which it can be determined, by means of a second adjusting resistor, which part of a current dependent on the input voltage at the input of the transadmittance of the transsusceptance amplifier is passed on to a current output of the transadmittance amplifier.

14. An amplifier arrangement as claimed in claim 13, characterized in that at least one of the first and second adjusting circuits is provided with two cross-coupled differential amplifiers, an output of which is coupled to an output of the transadmittance amplifier and inputs of which are coupled to respective outputs of a further differential amplifier degenerated by a resistor, a first input of said further degenerated differential amplifier being coupled to a wiping contact of the adjusting resistor and a second input being coupled to a reference voltage terminal.

15. An amplifier arrangement as claimed in claim 14, characterized in that the transimpedance amplifier has an input stage comprising:
a first differential amplifier including a first and a second transistor, an emitter of the first transistor being coupled to an emitter of the second transistor and to a first current source, a collector of the first transistor being coupled to the input of the transimpedance amplifier and a collector of the second transistor being coupled to a reference voltage terminal; and
a second differential amplifier including a third and a fourth transistor, an emitter of the third transistor being coupled to an emitter of the fourth transistor and to a second current source, bases of the third and the fourth transistors being coupled to bases and the collectors of the second and the first transistor, respectively, a collector of the fourth transistors being coupled to a first output of the input stage and a collector of the third transistor being coupled to a second output of the input stage.

16. An amplifier arrangement as claimed in claim 14, characterized in that the transimpedance amplifier has an input stage comprising:
a first differential amplifier including a first and a second transistor, an emitter of the first transistor being coupled to an emitter of the second transistor and to a first current source, a collector of the first transistor being coupled to the input of the transimpedance amplifier, and a collector of the second transistor being coupled to a reference voltage terminal;
a second differential amplifier including a third and a fourth transistor, an emitter of the third transistor being coupled to an emitter of the fourth transistor and to a second current source, bases of the first and the second transistors being coupled to bases and collectors of the fourth and the third transistors, respectively;
a fifth transistor having a base coupled to the input of the transimpedance amplifier, an emitter coupled to a collector of the fourth transistor, and a collector coupled to a first output of the input stage; and
a sixth transistor having a base coupled to the reference voltage terminal, an emitter coupled to a collector of the third transistor, and a collector coupled to a second output of the input stage.

17. An amplifier arrangement as claimed in claim 15, characterized in that the collector of the second transistor is coupled to the reference voltage terminal via a third differential amplifier, an output of which is coupled to the collector of the second transistor, an inverting input is coupled to the input of the transimpedance amplifier and a non-inverting input is coupled to the reference voltage terminal.

18. An amplifier arrangement as claimed in claim 17, characterized in that the collectors which are coupled to the first and the second outputs of the input stage of the transimpedance amplifier are each coupled to said first and second outputs of the input stage by means of a field-effect transistor arranged in a common gate configuration.

19. An amplifier arrangement as claimed in claim 18, characterized in that the first output of the input stage of the transimpedance amplifier is coupled to a first input of an output stage, and in that the second output of the input stage of the transimpedance amplifier is coupled to a second input of the output stage by means of a current mirror circuit, an output of said output stage being coupled to the output of the transimpedance amplifier.

20. An amplifier arrangement as claimed in claim 19, characterized in that the output stage is constituted by a push-pull amplifier.

21. An amplifier arrangement as claimed in claim 20, characterized in that the push-pull amplifier comprises
a first field-effect transistor having a gate and a drain coupled to the second input of the output stage;
a second field-effect transistor having a gate coupled to the gate of the first field-effect transistor, and a source coupled to the output of the output stage;
a third field-effect transistor having a source coupled to the output of the output stage, and a gate of coupled to the first input of the output stage; and
a fourth field-effect transistor having a source coupled to a source of the first field-effect transistor, and a gate and a drain coupled to the gate of the third field-effect transistor, the first and the second field-effect transistors being of a conductivity type which is opposed to a conductivty type of the third and the fourth field-effect transistors.

22. An integrated amplifier circuit as claimed in claim 11, characterized in that it comprises a current multiplication circuit for multiplying a current in the transadmittance circuit by the quotient of a resistance of a resistor within the integrated amplifier circuit and a resistance of a resistor outside the integrated amplifier circuit.

* * * * *